United States Patent
Sonobe et al.

(10) Patent No.: US 6,258,619 B1
(45) Date of Patent: Jul. 10, 2001

(54) FABRICATION OF SEMICONDUCTOR LIGHT EMITTING DEVICE

(75) Inventors: Masayuki Sonobe; Shunji Nakata; Yukio Shakuda; Tsuyoshi Tsutsui; Norikazu Itoh, all of Kyoto (JP)

(73) Assignee: Rohm LTD, Tokyo (JP)

( * ) Notice: Subject to any disclaimer, the term of this patent is extended or adjusted under 35 U.S.C. 154(b) by 0 days.

(21) Appl. No.: 09/337,396

(22) Filed: Jun. 22, 1999

Related U.S. Application Data

(62) Division of application No. 08/986,574, filed on Dec. 5, 1997, now abandoned.

(30) Foreign Application Priority Data

Dec. 6, 1996 (JP) .................................... 8-326333
Dec. 6, 1996 (JP) .................................... 8-326335

(51) Int. Cl.$^7$ .................................................. H01L 21/20
(52) U.S. Cl. .................................................................. 438/47
(58) Field of Search ........................... 438/40, 45, 46; 257/94, 96, 97; 117/89, 93, 102, 108, 952

(56) References Cited

U.S. PATENT DOCUMENTS

| | | |
|---|---|---|
| 4,759,024 | 7/1988 | Hayakawa et al. . |
| 5,670,798 | 9/1997 | Schetzina . |
| 5,679,965 | 10/1997 | Schetzina . |
| 5,684,309 | 11/1997 | McIntosh et al. . |
| 5,732,098 | 3/1998 | Nisitani et al. . |
| 5,764,673 | 6/1998 | Kawazu et al. . |
| 5,834,331 | * 11/1998 | Razeghi .................................. 438/40 |

* cited by examiner

*Primary Examiner*—Keith Christianson
(74) *Attorney, Agent, or Firm*—Arent Fox Kinter, Plotkin Kahn PLLC

(57) ABSTRACT

A semiconductor light emitting device includes a substrate, an n-type layer formed of gallium-nitride based compound semiconductor formed on the substrate, and a p-type layer formed of gallium-nitride based compound semiconductor formed on the substrate. Semiconductor overlying layers are constituted by the n-type layer and the p-type layer on the substrate. A light emitting layer is formed together with the n-type and p-type layers in the semiconductor overlying layers to emit light. At least one of the n-type layer and the p-type layer is formed by three or more overlying sublayers including a sublayer of $Al_yGa_{1-y}N$ ($0<y\leqq0.5$) and a sublayer of $Al_uGa_{1-u}N$ ($0\leqq u<y$). With this structure, the semiconductor light emitting device is almost free from lattice mismatch to thereby enhance electron mobility and hence light emission efficiency even where the overlying semiconductor layers are different in lattice constant from the substrate.

3 Claims, 3 Drawing Sheets

FABRICATION OF SEMICONDUCTOR LIGHT EMITTING DEVICE

This is a divisional of application Ser. No. 08/986,574 filed Dec. 5, 1997, now abandoned.

BACKGROUND OF THE INVENTION

This invention relates to a semiconductor light emitting device having a light emitting layer provided by semiconductor layers that are largely different in lattice constant therebetween, e.g. where gallium-nitride based compound semiconductor layers are formed overlaid on a sapphire substrate. More particularly, this invention relates to a semiconductor light emitting device which is structured to have semiconductor layers having a light emitting layer and so on, that are less affected by lattice mismatch in the crystalline structure and hence almost free of crystalline disorders.

The conventional semiconductor light emitting device for emitting light, e.g. bluish light, is structured as shown in FIG. 3. That is, the semiconductor light emitting device includes a sapphire substrate 21. The sapphire substrate 21 has thereon a low-temperature buffer layer 22, e.g. of GaN, an n-type layer (cladding layer) 23 of n-type GaN grown by epitaxy, an active layer (light emitting layer) 24, e.g. of InGaN-based compound semiconductor having a bandgap energy smaller than that of the cladding layer so as to define an emission-light wavelength, and a p-type layer (cladding layer) of p-type GaN. Note that in this specification "InGaN-based" means a chemical composition containing In and Ga in a variable ratio therebetween. The light emitting device has a p-side electrode formed on a surface thereof and an n-side electrode on a surface of the n-type layer 23 exposed by partly etching the overlying semiconductor layers. Incidentally, the n-type layer and the p-type layer, in many cases, have respective AlGaN-based compound semiconductor layers on an active layer 23 side, in order to enhance carrier confining effects, wherein "AlGaN-based" means a chemical composition containing Al and Ga in a variable ratio therebetween.

As stated above, the conventional semiconductor light emitting device formed of a gallium-nitride based semiconductor e.g. for bluish light emission is provided with a GaN layer or an AlGaN-based compound semiconductor layer as n-type and p-type layers. However, the lattice constant is different between sapphire, i.e. 4.6 angstrom, and GaN, i.e. 3.19 angstrom, or $Al_{0.3}Ga_{0.7}N$, i.e. 3.13 angstrom. Moreover, the lattice constant of GaN or $Al_{0.3}Ga_{0.7}N$ is different from that of the InGaN-based semiconductor for the light emitting layer. Therefore, there is a tendency of incurring lattice mismatch in the n-type or p-type layer structure, impeding the flow of electric current. Further, there is a problem that cracks are caused between the crystals to reach the light emitting layer due to the difference in crystal lattice constant, with the result that the device has a lower light emitting efficiency. In particular, the n-type layer, in most cases, is formed to a layer thickness of approximately 4 to 5 $\mu$m, which accelerates accumulation of crystalline disorders and causes further crystal mismatch.

In this conventional structure, the emission-light wavelength is determined by the bandgap energy of the material of the light emitting layer 24. Where $In_xGa_{1-x}N$ is employed for the light emitting layer 24, the increase in mixture crystal ratio x of In (lowering in bandgap energy for the light emitting layer) increases the wavelength of light emitted. Conversely, when the ratio x is decreased (the bandgap energy is increased), the wavelength of light emitted is shortened. In order to obtain a wavelength covering from 450 nm for blue light (Zn may be doped at the In mixed crystal ratio x of around 0.2, though blue light is available with the ratio x of approximately 0.4) to a green light portion (the ratio x is approximately 0.5), an InGaN-based compound semiconductor is utilized. When providing a shorter wavelength light than the above, a material such as GaN or an AlGaN-based compound semiconductor is employed for the light emitting layer. In this manner, the double heterojunction structure has the light emitting layer sandwiched between the semiconductor layers that are different in lattice constant from that of the light emitting layer. In particular, the InGaN-based compound semiconductor layer tends to become unstable in crystalline texture, as the thickness thereof increases. When the InGaN-based compound semiconductor layer is sandwiched between the semiconductor layers that are different in lattice constant therefrom, the different lattice mismatch tends to cause cracks in the crystal and impede electric current flow. Thus, there is a problem that the light emitting efficiency is lowered.

On the other hand, there is a disclosure by Japanese Provisional Patent Publication (Kokai) No. H5-110138 and Japanese Provisional Patent Publication (Kokai) No. H5-110139 that describes a method, in order to form a $Ga_pAl_{1-p}N$ layer, of forming thin GaN and AlN layers alternately. In this method, thin GaN and AlN layers are alternately overlaid so that the content ratio of Ga and Al of these layer becomes coincident with that of the $Ga_pAl_{1-p}N$ layer. This technique, however, is a method to exclusively provide a $Ga_pAl_{1-p}N$ layer and not applicable to other film materials than GaN and AlN due to difficulty in growing a crystal with high property, as is described on page 3, column, 3, lines 29 to 31 in Japanese Provisional Patent Publication No. H5-110138.

SUMMARY OF THE INVENTION

It is a primary object of the present invention to provide a semiconductor light emitting device which is structured by forming semiconductor layers, even where they are different in lattice constant from the substrate, in a manner almost free from lattice mismatch in the crystalline structure, thereby raising electron mobility and hence light emission efficiency.

It is another object of the present invention to provide a semiconductor light emitting device which has a double hetero-junction structure having a light emitting layer almost free from crystalline disorder, raising electron mobility and hence excellent light emission efficiency.

In accordance with the preset invention, there is provided a semiconductor light emitting device comprising:

a substrate;

an n-type layer formed of gallium-nitride based compound semiconductor formed on the substrate;

a p-type layer formed of gallium-nitride based compound semiconductor formed on the substrate;

semiconductor overlying layers having a light emitting layer to emit light formed together with the n-type layer and the p-type layer on the substrate; and wherein at least one of the n-type layer and the p-type layer is formed by three or more overlying sublayers including a sublayer of $Al_yGa_{1-y}N$ ($0<y\leq0.5$) and a sublayer of $Al_uGa_{1-u}N$ ($0\leq u<y$).

With this structure, the layers are provided thin and free of accumulation of crystalline disorder due to difference in lattice constant, reducing lattice mismatch in the crystalline structure.

Here, gallium-nitride based compound semiconductor refers to a semiconductor formed of a compound of a group-III element Ga and a group-V element N, including those having the group III element Ga partly substituted by other group-III elements such as Al and In, or those having the group-V element N partly substituted by other group-V elements such as P and As.

The $Al_yGa_{1-y}N$ sublayer may be thinner in layer thickness than the $Al_uGa_{1-u}N$ sublayer, the $Al_yGa_{1-y}N$ sublayer and the $Al_uGa_{1-u}N$ sublayer being alternately overlaid one another. By so constructing, the large bandgap $Al_yGa_{1-y}N$ sublayers can be formed without encountering crystalline disorder, despite the fact that they are largely different in lattice constant from the substrate.

For example, the $Al_yGa_{1-y}N$ sublayer may have a layer thickness of 10 to 100 nm and $Al_uGa_{1-u}N$ sublayer has a layer thickness of 50 to 400 nm.

According to another embodiment of the present invention, the light emitting layer is formed by an active layer sandwiched between the n-type layer and the p-type layer, the active layer having, as overlying sublayers, a first semiconductor sublayer for defining a wavelength of light emitted and a second semiconductor sublayer having a bandgap energy greater than that of the first semiconductor sublayer.

With this structure, if the first semiconductor sublayers and the second semiconductor sublayers respectively include 10 sublayers in number, they can be formed as thin as 5 to 10 nm per sublayer, eliminating accumulation of crystalline distortion. That is, during manufacturing, the semiconductor sublayers are overlaid before the crystalline disorder develops to an unsatisfactory extent, providing a light emitting layer reduced of crystalline distortion therethroughout. If the layer thickness of the semiconductor sublayer is determined to be 10 nm or thinner, there is almost no occurrence of crystalline distortion, thus providing effects by only two first semiconductor sublayers. On the other hand, since the emission light wavelength is predominated by the smaller bandgap energy of semiconductor sublayers, the emission light wavelength is determined by the first semiconductor sublayers and the larger-bandgap second semiconductor sublayers has substantially no effects upon the wavelength of light emitted.

For example, the n-type layer and the p-type layer are each formed of gallium-nitride based compound semiconductor, the first semiconductor sublayer being formed of $In_xGa_{1-x}N$ ($0<x\leq0.5$) and the second semiconductor sublayer formed of AlGaN, AlGaN-based compound semiconductor or $In_zGa_{1-z}N$ ($0\leq z<x$), or otherwise, the first semiconductor sublayer being formed of $Al_sGa_{1-s}N$ ($0\leq s\leq0.2$) and the second semiconductor sublayer formed of $Al_tGa_{1-t}N$ ($s<t\leq0.5$).

In accordance with the method of manufacturing a semiconductor light emitting device, by supplying a reactive gas to a substrate placed in an MOCVD apparatus, comprising the steps of:

(a) forming an n-type layer of gallium-nitride based compound semiconductor on the substrate;

(b) forming a first semiconductor sublayer of $In_xGa_{1-x}N$ ($0<x\leq0.5$) on the n-type layer by introducing trimethyl-indium into the reactive gas;

(c) forming a second semiconductor sublayer of $In_zGa_{1-z}N$ ($0\leq z<x$) on the first semiconductor sublayer by reducing the supply ratio of trimethyl-indium in the reactive gas;

(d) forming an active layer formed by the first semiconductor sublayer and the second semiconductor sublayer alternately overlaid one another by repeating the process of the steps (b) and (c); and (e) forming subsequently a p-type layer of gallium-nitride based compound semiconductor on the active layer.

The second semiconductor sublayer may be formed, in the step (c), by not reducing the supply ratio of trimethyl-indium or elevating an reacting temperature with reduction of the supply ratio thereof.

For a fuller understanding of the nature and advantages of the invention, reference should be made to the ensuing detailed description taken in conjunction with the accompanying drawings.

BRIEF DESCRIPTION OF THE DRAWINGS

FIG. 1(a) is a sectional view of a semiconductor light emitting device having gallium-nitride based compound semiconductor layers formed on a sapphire substrate according to one embodiment of the present invention, while FIG. 1(b) is a partial magnifying view showing an n-type layer of the same device;

FIG. 2(a) is a sectional view of a semiconductor light emitting device having an active layer formed by overlying sublayers between cladding layers according to another embodiment of the present invention, while FIG. 2(b) is a partial magnifying view showing the active layer of the same device.

DETAILED DESCRIPTION

Figure 1:
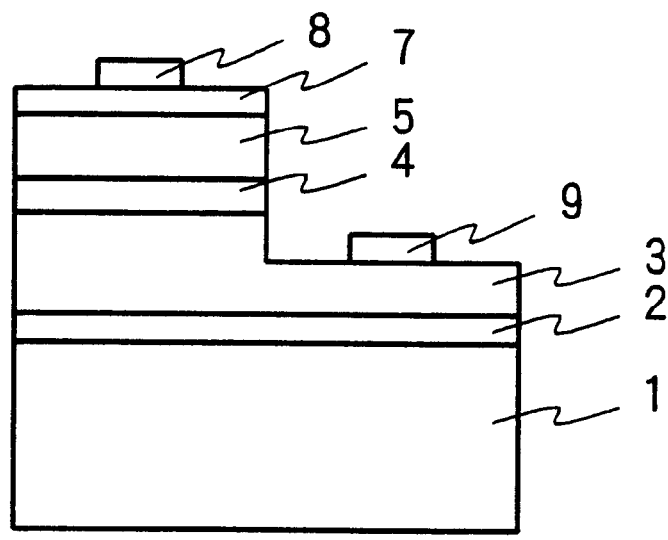
Figure 1:
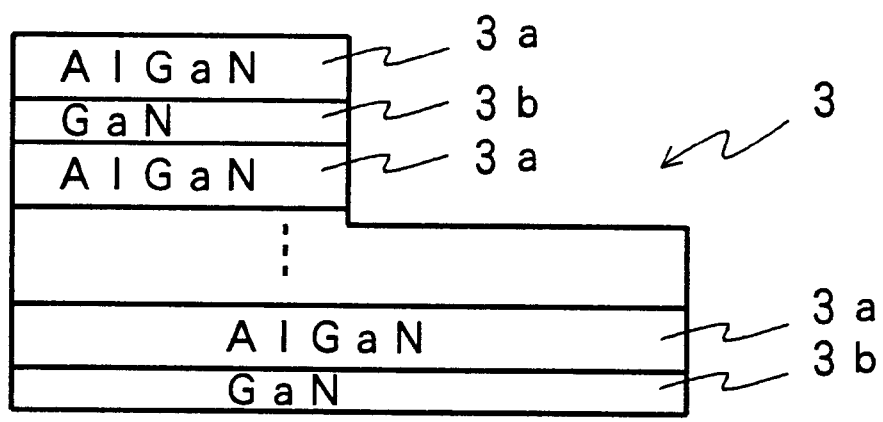

Referring to FIG. 1(a), there is illustrated a semiconductor light emitting device which includes a substrate 1 formed, for example, of sapphire ($Al_2O_3$ single crystal) and semiconductor layers 2–5 to constitute a light emitting region. The device also has an upper electrode (p-side electrode) 8 formed on the surface of the semiconductor layer 5 through a diffusion metal layer 7, and a lower electrode (n-side electrode) 9 formed on a surface of an n-type semiconductor layer 3 exposed by partly etching the overlying semiconductor layers 3–5. The overlying n-type semiconductor layer 3 and/or the p-type semiconductor layer 5 is formed by alternately overlaying a first AlGaN-based compound semiconductor layers 3a of $Al_yGa_{1-y}N$ ($0<y\leq0.5$, e.g. y=0.15) and a second AlGaN-based compound semiconductor layers 3b of $Al_uGa_{1-u}N$ ($0\leq u<0.5$, e.g. u=0), as shown in FIG. 1(b) wherein the n-type layer 3 is shown as an example by magnification.

The semiconductor layers on the substrate 1 includes a low-temperature buffer layer 2 formed by growing, for example, GaN to a layer thickness of approximately 0.01–0.2 $\mu$m. On the low-temperature buffer layer 2, the n-type layer (cladding layer) 3 is formed by growing to a layer thickness of approximately 1–5 $\mu$m. This n-type layer 3, as shown in FIG. 1(b), is constituted by respective 10 sublayers, alternately overlaid, of the second cladding layer 3b of n-type GaN in layer thickness of approximately 300–400 nm and the first cladding layer 3a of n-type $Al_{0.15}Ga_{0.85}N$ in layer thickness of approximately 50–100 nm. On the n-type layer 3, a light emitting layer 4 is formed of a material, e.g. $In_xGa_{1-x}N$ ($0<x\leq0.5$, e.g. x=0.05), having a bandgap energy smaller than that of the cladding layer to a layer thickness of approximately 0.05–0.3 $\mu$m. On the light emitting layer 4, the p-type layer (cladding layer) 5 is formed by growing to a layer thickness of approximately 0.3–0.6 $\mu$m. This p-type layer 5 is constituted by respective 5 overlying sublayers, alternately overlaid, of the third cladding layer, not shown, of p-type $Al_{0.15}Ga_{0.85}N$ in layer thickness of approximately 10–20 nm and the fourth cladding layer 3a of GaN in layer thickness of approximately 50–80 nm. Note that the n-type layer 3 and the p-type layer 5 are not limited to the aforesaid material, and they are formable by overlying sublayers with two or more materials of AlGaN-based compound semiconductors that are varied in Al composition ratio in a range of from 0 to 0.5. However, it is preferred from the viewpoint of carrier confining effects that the n-type layer 3 at a portion adjacent the low-temperature buffer layer 2 is of GaN that is identical or similar in composition thereto while the cladding layer 3, 5 at a portion adjacent the active layer 4 is of AlGaN-base compound semiconductor with an increased Al composition ratio.

The semiconductor light emitting device of the present invention is characterized by the n-type layer 3 and the p-type layer 5 having a greater bandgap energy than the active layer 4 to confine carriers in the active layer 4, wherein the n-type layer 3 and the p-type layer 3 are respectively formed by the overlying first and second cladding sublayers 3a, 3b, different in composition and the overlying third and fourth cladding sublayers different in composition. The overlying structure with the first and second cladding sublayer or the third and fourth cladding layers is to prevent against accumulation of crystalline disorders (or distortions), lowering in electron mobility and tendency of crack occurrence encountered upon forming the layer 3, 5 to a thick layer thickness by using a same composition semiconductor material. It is therefore preferred that the thickness of the sublayer is formed thin. However, if the thickness of the overlying sublayer is taken excessively thin, the process of epitaxial growth becomes complicated. Therefore, the first cladding layer is determined in a layer thickness of approximately 10–20 nm, the second cladding layer in a layer thickness of approximately 300–400 nm, the third cladding layer in a layer thickness of approximately 10–20 nm, and the fourth cladding layer in a layer thickness of approximately 50–80 nm. In this manner, the n-type layer 3 and the p-type layer 5 are each constituted by three or more overlying sublayers. Incidentally, these n-type layers 3 and the p-type layers 5 may be formed by three or more overlying sublayers which are different in composition.

Now explanations will be made on the function of the n-type and p-type layers of the semiconductor light emitting device according to the above embodiment. The n-type and p-type layers are formed by using a semiconductor material with a bandgap energy greater than that of the active layer sandwiched therebetween, in order to enhance the carrier confining effect for light emission due to carrier recombination within the active layer. In such cases, if each of the n-type layer and the p-type layer is formed by overlying sublayers using different materials, the carrier confinement is effected by the material which is greater in bandgap energy. Consequently, the sublayers greater in Al ratio in the first and third cladding layers functions as a cladding layer. In the meanwhile, the n-type layer and the p-type layer are each structured by overlying sublayers so that, when a sublayer under growth increases its thickness to start accumulating crystalline disorders, a different composition of the next sublayer is subsequently grown thereon to cut off the accumulation of disorder. Thereupon, although accumulation of crystalline disorders begins again in the newly grown sublayer, a next sublayer begins to grow before the disorder accumulation develops to an excessive or unsatisfactory extent. Thus, the process of forming the sublayers is repeated in a manner eliminating therefrom excessive disorders. The obtained n-type and p-type layers, even if their whole thickness becomes thick, are satisfactorily free from adverse effects of accumulating crystalline disorders. This in turns serves to eliminate or reduce lattice mismatch in overlying sublayer crystalline texture, even when the sublayers are formed by semiconductor materials different in lattice constant. Incidentally, when the overlying-sublayer structure is given to either one of the n-type layer 3 or the p-type layer 5 instead of both of them, the effects available is similar to the above embodiment. Nevertheless, the overlying-sublayer structure for the n-type layer 3 is more effective rather than that of the p-type layer 5, because the layer 3 is thicker in layer thickness and closer to the sapphire substrate.

Now explanations will be made about the method for manufacturing the semiconductor light emitting device shown in FIGS. 1(a) and (b). First, a reactive gas, containing trimethyl-gallium (TMG) and ammonia ($NH_3$), and an n-type dopant gas of $SiH_4$, together with a carrier gas of $H_2$, are supplied to form a GaN low-temperature buffer layer 2 on the sapphire substrate 1, by a Metalorganic Chemical Vapor Deposition (MOCVD) technique, to a layer thickness of approximately 0.01–0.2 µm at a low temperature of approximately 400–600° C.

Then, trimethyl-aluminum (TMA) is introduced or added, by switching, into the above reactive gas with the supply of other gasses maintained, to form an overlying sublayer of an n-type GaN second cladding layer 3b in layer thickness of approximately 300–400 nm and an n-type $Al_yGa_{1-y}N$ first cladding layer 3a in layer thickness of approximately 50–100 nm. The n-type GaN second cladding layer 3b and the n-type $Al_yGa_{1-y}N$ first cladding layer 3a are alternately formed by, e.g. respective 10 sublayers, in a repeated manner, thereby providing an n-type layer 3 in total layer thickness of approximately 4–5 µm.

Then, the supply of the n-dopant gas and the TMA gas is suspended to add trimethyl-indium (TMIn) into the reactive gas to thereby form an $In_xGa_{1-x}N$ active layer 4 to a layer thickness of approximately 0.1–0.2 µm.

Thereafter, a p-type layer 5 of an overlying-sublayer structure of third and fourth cladding sublayers is formed to a total layer thickness of 0.3–0.6 µm in a manner similar to the formation of the n-type layer 3, wherein the n-dopant gas is replaced by a dopant gas of cyclopentadienyle-magnesium ($Cp_2Mg$) or dimethylezinc (DMZn).

Subsequently, Ni and Au are evaporated onto the surface of the p-type layer 5 and then sintered to be formed into a diffusion metal layer 7 in a layer thickness of approximately 2–100 nm. In order to provide a lower electrode, the semiconductor layers formed are partly etched by reactive ion etching using chlorine gas, etc. so as to partly expose the n-type layer 3. Then, the electrode metal is then evaporated onto the surface of the substrate to provide an upper electrode 8 and a lower electrode 9, thus providing a semiconductor light emitting device as shown in FIG. 1(a).

Although in the above embodiment explanations were made on the case of the double hetero-junction structure, the present invention can be similarly applied to a p/n junction structure. The present invention is not limited to bluish-light emitting device using a gallium-nitride based compound semiconductor, but also applicable to other types of semiconductor light emitting devices having a light emitting layer in semiconductor overlying layers largely different in lattice constant wherein disorders tend to occur in their crystalline texture.

Now, explanations will be made on a semiconductor light emitting device according to another embodiment of the present invention with reference to FIGS. 2(a) and (b). The semiconductor light emitting device of this embodiment includes a sapphire ($Al_2O_3$ single crystal) substrate 1, semiconductor layers 2–5 formed on the surface of the substrate 1 to have a light emitting region, similarly to the embodiment of FIG. 1(a). The device has an upper electrode (p-side electrode) 8 on the top surface thereof through a diffusion metal layer 7 and a lower electrode (n-side electrode) 9 on the surface of an n-type layer 3 exposed by partly etching to remove away the semiconductor layers 3–5. This embodiment has a light emitting layer 4 constituted by thin-film sublayers of a first semiconductor sublayer 4a and a second semiconductor sublayer 4b alternately overlying.

The semiconductor layers on the substrate 1 include, a low-temperature buffer layer 2 formed, for example, of GaN in a layer thickness of approximately 0.01–0.2 μm on the substrate, and an n-type layer (cladding layer) 3 formed of n-type GaN in a layer thickness of approximately 1–5 μm thereon. Further, a light emitting layer 4 is formed in a total layer thickness of approximately 55–150 nm on the n-type layer 3. This light emitting layer 4 is formed by alternately-overlaid sublayers of a first semiconductor sublayer 4a formed, for example, of $In_xGa_{1-x}N$ (0<x≦0.5, e.g. x=0.05) in a layer thickness of approximately 5–10 nm, and a second semiconductor sublayer 4a formed of AlN in a layer thickness of approximately 0.5–5 nm, wherein the material of the first semiconductor sublayer 4a, i.e. $In_xGa_{1-x}N$, has a bandgap energy lower than that of the cladding layer. These first semiconductor sublayers 4a and the second semiconductor sublayers 4b are each formed, for example, by 10 in number. On the light emitting layer 4, a p-type layer (cladding layer) 5, having a p-type AlGaN-based compound semiconductor sublayer 5a and a p-type GaN sublayer 5b, is formed in a total layer thickness of approximately 0.5–1 μm. Incidentally, the double-layered structure of the p-type layer 5 with the p-type AlGaN-based compound semiconductor sublayer 5a and the p-type GaN sublayer 5b is for providing an Al-contained layer for enhancing carrier confinement effects. Instead, the p-type layer 5 may be of a single GaN layer. On the other hand, the n-type layer 3 may be formed by an overlying structure including an AlGaN-based semiconductor sublayer, or by other Gallium-nitride based compound semiconductor sublayer.

The semiconductor light emitting device according to the present embodiment is characterized by the light emitting layer 4 which is of the multi-layered structure having, by alternately overlaying, the first semiconductor sublayer 4a having a bandgap energy lower than that of the cladding layer to define a emission-light wavelength and the second semiconductor sublayer 4b having a bandgap energy greater than that of the first sublayer. This first semiconductor sublayer 4a is for emitting light through carrier recombination, which light has its wavelength determined by the energy bandgap of this semiconductor sublayer. Accordingly, the material of the same sublayer is determined by the wavelength of light to be emitted. To obtain blue light (with wavelength of 450 nm) for example, Zn-doped $In_{0.2}Ga_{0.8}N$ (or non-doped $In_{0.4}Ga_{0.6}N$) is employed as a material for the first semiconductor sublayer 4a.

The second semiconductor sublayer 4b is to prevent excessive increase in layer thickness of the first semiconductor sublayer, which is formed by a semiconductor material greater in bandgap energy than the first semiconductor sublayer 4a in order not to have effects on the emission light wavelength.

As a material for the second semiconductor sublayer 4b may be used AlN, AlN-based compound semiconductor, or InGaN-based compound semiconductor having such an In mixing crystal ratio that the bandgap energy is smaller than that of the first semiconductor sublayer. The first semiconductor sublayer 4a is preferably formed thin, e.g. a layer thickness of approximately 5–10 nm, in order to avoid accumulation of crystal disorder, whereas the second semiconductor sublayer 4b is to prevent against thickening of a single layer so that it may be formed to such a thickness, i.e. 0.5–5 nm, that provides change in chemical composition relative to the first semiconductor sublayer.

Now explanations will be made on the operation of the light emitting layer of the semiconductor light emitting device according to the embodiment of the invention. The material for the light emitting layer, e.g. $In_{0.2}Ga_{0.8}N$, has a lattice constant of 3.47 angstroms and the material for the cladding layer, e.g. $Al_{0.1}Ga_{0.9}N$, a lattice constant of 3.12 angstrom. They are largely different in lattice constant. Accordingly, if $In_{0.2}Ga_{0.8}N$ is deposited to 50 nm or thicker on $Al_{0.1}Ga_{0.9}N$, crystal distortion is cumulated to raise a problem of hindering current flow or causing cracks in the semiconductor layer. However, since in the present invention, the $In_xGa_{1-x}N$ sublayer when deposited to a thickness of 5–10 nm is replaced by the AlN layer, the crystal structure is changed before the crystalline disorder develops to an excessive extent, thus cutting off the accumulation of crystalline disorders.

On the other hand, the lattice constant of AlN is different in lattice constant from that of InGaN-based compound semiconductor or AlGaN-based compound semiconductor, and there develops cumulative disorders if the AlN layer becomes thick. However, the AlN layer is in layer thickness of approximately 0.5–5 nm, and accordingly almost no disorder is accumulated and new $In_xGa_{1-x}N$ is deposited thereon. This process is repeated so that the resulting sublayers are almost free from cumulative disorders. Thus, the light emitting layer 4 as a whole is in a layer thickness of approximately 55–150 nm that is free from crystalline disorders.

In the meanwhile, light emission is made by carrier recombination in the first semiconductor sublayers 4a of the smaller energy bandgap, wherein the second semiconductor sublayers 4b of the larger bandgap energy do not contribute thereto. In other words, the total thickness of the first semiconductor sublayers 4a resultingly contributes to emission of light, while the second semiconductor sublayers 4b merely function as a buffer layer to cut off the accumulation of disorders.

Where AlN is employed for the second semiconductor sublayer 4b, the relation in lattice constant thereof to the InGaN-based compound semiconductor serving to emit light, i.e. the first semiconductor sublayer, and the GaN material occupying a greater portion of the overlying n-type and p-type layers is given as AlN<GaN<InGaN. The light emitting layer 4 is structured by overlying sublayers of AlN having a smaller lattice constant and InGaN having a greater lattice constant so that the lattice constant for these materials is preferably averaged to the lattice constant of GaN. Incidentally, although the semiconductor materials for the light emitting layer 4 are different in lattice constant, they are in thin films and almost free from accumulation of disorder and hence the problem of disorder. Moreover, the provision of the AlN layer provides quantum effects raising the efficiency of light emission.

Now explanations will be made on the method for manufacturing the semiconductor light emitting device shown in FIG. 2(a). First, similarly to the embodiment explained hereinbefore, a reactive gas, containing trimethyl-gallium (TMG) and ammonia (NH$_3$), and an n-type dopant gas of SiH$_4$, together with a carrier gas of H$_2$, are supplied to form a GaN low-temperature buffer layer 2 on the sapphire substrate 1, by a Metal-Organic Chemical Vapor Deposition (MOCVD) technique, to a layer thickness of approximately 0.01–0.2 µm at a low temperature of approximately 400–600° C. Subsequently, an n-type layer (cladding layer) 3 is formed at an elevated temperature of approximately 600–1200° C. to a layer thickness of approximately 1–5 µm.

Then, trimethyl-indium (hereinafter called "TMIn") is added to the reactive gas to form a first semiconductor sublayer 4a, for example, of In$_{0.05}$Ga$_{0.95}$N to a layer thickness of approximately 5–10 nm for a light emitting layer 4. Subsequently, the reactive gas is changed by NH$_3$ and trimethyl-aluminum (hereinafter called "TMA") to form a second semiconductor sublayer 4b of AlN to a layer thickness of 0.5–5 nm. This reactive gas change is repeated 9 times for the first and the second sublayers to thereby provide a light emitting layer 4 having both sublayers alternately overlying.

Here, if the second semiconductor sublayer 4b is formed of an AlGaN-based compound semiconductor, TMG may be further added to the aforesaid NH$_3$ and TMA. Where In$_z$Ga$_{1-z}$N is formed as the second semiconductor sublayer 4b, the supply rate of the TMIn gas may be reduced subsequent to the formation of the first semiconductor sublayer 4a, or the reaction temperature is raised from the ordinary temperature of approximately 800° C. By doing so, a low In composition of an In$_z$Ga$_{1-z}$N sublayer is provided for the sublayer 4b. Thus, the overlaying structure is provided only by controlling the supply rate of TMIn or the reaction temperature. Furthermore, where GaN is employed for the first semiconductor sublayer 4a and AlGaN-based compound semiconductor is used for the second semiconductor sublayer 4b, these sublayers are available by changing the reactive gas in a way stated before. Where the first and second semiconductor sublayers are formed by varying the Al ratio for the AlGaN-based compound semiconductor, these sublayers different in composition can be formed by varying the supply ratio in the reactive gas TMA.

Thereafter, the reactive gas is changed by NH$_3$, TMG and TMA, and further cyclopentadienyle-magnesium (Cp$_2$ Mg) or dimethylezinc (DMZn) is introduced as a p-type dopant, a p-type AlGaN-based compound semiconductor layer 5a is formed to a layer thickness of approximately 0.1–0.5 µm. Then, the supply of TMA in the reactive gas is stopped to form a p-type GaN layer 5b to a layer thickness of 0.1–0.5 µm, thereby providing a p-type layer 5.

Figure 2:
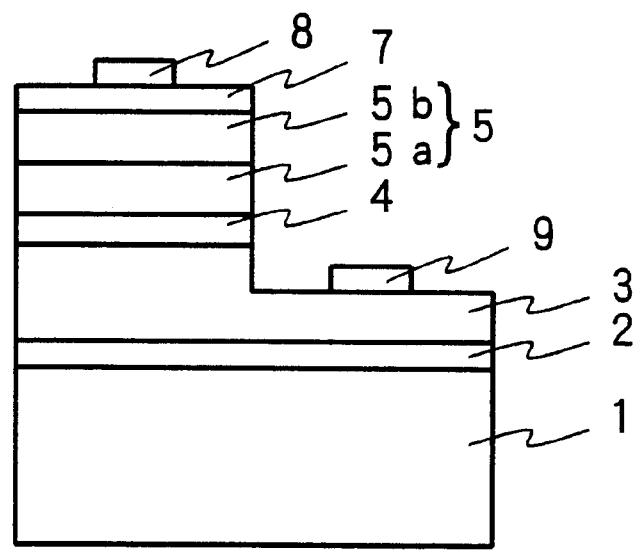
Figure 2:
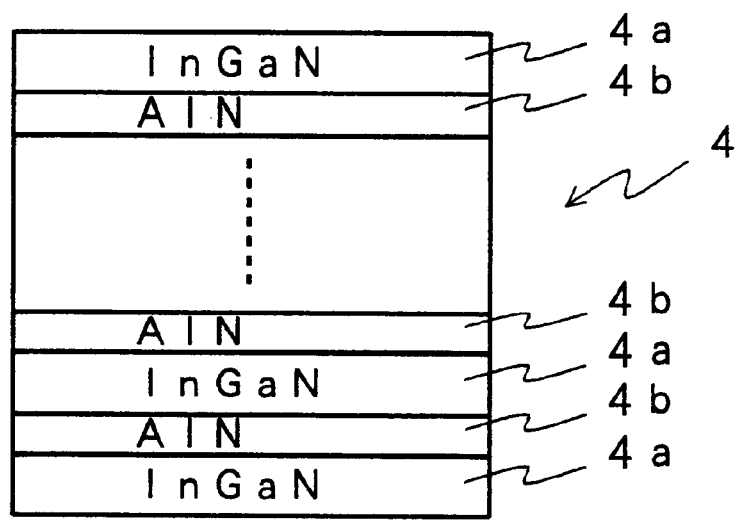
Figure 3:
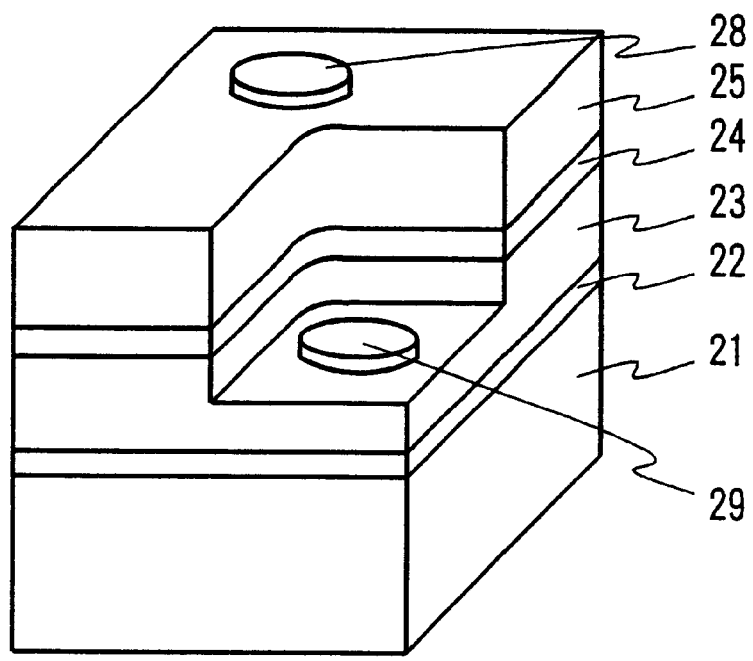
FIG. 3 is a perspective view of a conventional semiconductor light emitting device.

Thereafter, a diffusion metal layer 7, a p-side electrode 8, and an n-side electrode 9 are formed in a manner similar to the embodiment described hereinbefore, thus providing a semiconductor light emitting device as shown in FIG. 2(a).

In the FIG. 2(a) embodiment, the n-type layer and the p-type layer are not in an overlying thin-film form. However, if the n-type layer and/or the p-type layer is formed in the overlying thin-film structure as shown in FIG. 1(a), the device will be free from crystalline disorders throughout its entire semiconductor layers, further enhancing the light emission efficiency.

Although in the above embodiments shown were semiconductor light emitting devices having gallium-nitride based compound semiconductors for bluish light emission, the present invention is not limited to such device. The present invention is also applicable to a doubblehetero-structure semiconductor light emitting device having semiconductor layers that tend to have distortions in the crystalline structure due to difference in lattice constant therebetween.

As described above, the present invention can provide a semiconductor light emitting device having, on a substrate, semiconductor layers that are almost free from lattice mismatch therebetween to thereby improve electron mobility, even where the materials of the semiconductor layers are different in lattice constant. Therefore, the semiconductor light emitting device is improved in light emission efficiency.

Furthermore, where the invention is applied to a semiconductor light emitting device of a double hetero-junction structure having a light emitting layer sandwiched between semiconductor layers different in lattice constant therefrom, the light emitting layer is almost free of lattice mismatch to improve electron mobility with improved light emission efficiency.

Although preferred embodiments have been described in some detail, it is to be understood that certain changes can be made by those skilled in the art without departing from the spirit and scope of the invention as defined by the appended claims.

What is claimed is:

1. A method of manufacturing a semiconductor light emitting device, by supplying a reactive gas to a substrate placed in an MOCVD apparatus, comprising the steps of:
    (a) forming an n-type layer of gallium-nitride based compound semiconductor on said substrate;
    (b) forming a first semiconductor sublayer of In$_x$Ga$_{1-x}$N (0<x≦0.5) on said n-type layer by introducing trimethyl-indium into the reactive gas;
    (c) forming a second semiconductor sublayer of In$_z$Ga$_{1-z}$N (0≦z<x) on said first semiconductor sublayer by reducing the supply ratio of trimethyl-indium in the reactive gas;
    (d) forming an active layer formed by said first semiconductor sublayer and said second semiconductor sublayer alternately overlaid one another by repeating the process of the steps (b) and (c); and
    (e) forming subsequently a p-type layer of gallium-nitride based compound semiconductor on said active layer.

2. A method of manufacturing a semiconductor light emitting device, by supplying a reactive gas to a substrate placed in an MOCVD apparatus, comprising the steps of:
    (a) forming an n-type layer of gallium-nitride based compound semiconductor on said substrate;
    (b) forming a first semiconductor sublayer of In$_x$Ga$_{1-x}$N (0<x≦0.5) on said n-type layer by introducing trimethyl-indium into the reactive gas;
    (c) forming a second semiconductor sublayer of In$_z$Ga$_{1-z}$N (0≦z<x) on said first semiconductor sublayer by elevating a reactive temperature;
    (d) forming an active layer formed by said first semiconductor sublayer and said second semiconductor sublayer alternately overlaid one another by repeating the process of the steps (b) and (c); and
    (e) forming subsequently a p-type layer of gallium-nitride based compound semiconductor on said active layer.

3. A method of manufacturing a semiconductor light emitting device according to claim 2, wherein said second semiconductor sublayer is formed, in step (c), by reducing the supply ratio of trimethyl-indium in the reactive gas.

* * * * *